United States Patent
Yang et al.

(10) Patent No.: US 11,152,438 B2
(45) Date of Patent: Oct. 19, 2021

(54) ARRAY SUBSTRATE HAVING VIA STRUCTURE COVERED BY RETAINING WALL AND DISPLAY PANEL HAVING THE SAME

(71) Applicant: Wuhan China Star Optoelectronics Semiconductor Display Technology Co., Ltd., Wuhan (CN)

(72) Inventors: Jie Yang, Wuhan (CN); Ming Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 84 days.

(21) Appl. No.: 16/625,740

(22) PCT Filed: Oct. 15, 2019

(86) PCT No.: PCT/CN2019/111188
§ 371 (c)(1),
(2) Date: Dec. 22, 2019

(87) PCT Pub. No.: WO2021/017180
PCT Pub. Date: Feb. 4, 2021

(65) Prior Publication Data
US 2021/0225967 A1   Jul. 22, 2021

(30) Foreign Application Priority Data
Jul. 30, 2019  (CN) .......................... 201910696320.8

(51) Int. Cl.
*H01L 29/08* (2006.01)
*H01L 27/32* (2006.01)
*H01L 51/52* (2006.01)

(52) U.S. Cl.
CPC ...... *H01L 27/3246* (2013.01); *H01L 51/5206* (2013.01)

(58) Field of Classification Search
CPC ............. H01L 27/3258; H01L 27/3246; H01L 51/5206; H01L 51/5044
See application file for complete search history.

(56) References Cited

U.S. PATENT DOCUMENTS

| | | | |
|---|---|---|---|
| 2004/0094768 A1* | 5/2004 | Yu | H01L 51/56 257/79 |
| 2008/0150423 A1* | 6/2008 | Kim | H01L 51/502 313/504 |
| 2014/0291687 A1* | 10/2014 | Nagasawa | G06T 11/001 257/72 |
| 2019/0165058 A1* | 5/2019 | Managaki | H01L 27/1255 |
| 2019/0280060 A1 | 9/2019 | Liu et al. | |

FOREIGN PATENT DOCUMENTS

| | | |
|---|---|---|
| CN | 206332028 | 7/2017 |
| CN | 108321181 | 7/2018 |
| JP | 2015-022531 | 2/2015 |

* cited by examiner

*Primary Examiner* — Phuc T Dang (57) ABSTRACT

The present invention discloses an array substrate and a display panel. The array substrate comprises a substrate, an anode layer disposed on the substrate, and a first retaining wall disposed on the anode layer and around the display area. The anode layer is provided with a first stress buffer area corresponding to the first retaining wall, and the first stress buffer area is provided with a first via structure passing through the anode layer.

20 Claims, 5 Drawing Sheets

ARRAY SUBSTRATE HAVING VIA STRUCTURE COVERED BY RETAINING WALL AND DISPLAY PANEL HAVING THE SAME

RELATED APPLICATIONS

This application is a National Phase of PCT Patent Application No. PCT/CN2019/111188 having International filing date of Oct. 15, 2019, which claims the benefit of priority of Chinese Patent Application No. 201910696320.8 filed on Jul. 30, 2019. The contents of the above applications are all incorporated by reference as if fully set forth herein in their entirety.

FIELD AND BACKGROUND OF THE INVENTION

The present invention relates to the field of display technologies, and in particular, to an array substrate and a display panel.

Organic light emitting diodes (OLEDs) have received attentions due to their advantages of self-luminescence, high contrast, wide viewing angle, low power consumption, and flexibility. Flexible OLEDs also gradually occupy the market because of their flexible, thin and light features.

At present, organic light emitting layers in the commonly used OLED are mostly completed by IJP (ink jet printing). Ink droplets have advantages of low viscosity, good fluidity, and good flatness. At the same time, because of good fluidity, some retaining walls must be set to limit printing ranges. Because the retaining wall mainly serves to limit the printing ranges of the ink droplets, it is generally a closed pattern surrounding a product.

Because film interfaces at the retaining walls have many undulations, stress tends to concentrate at positions of the retaining walls and causes peeling and separations between film layers, which mainly occur between ITO/Ag/ITO in an anode layer.

SUMMARY OF THE INVENTION

In display panels, because film interfaces at retaining walls have many undulations, stress tends to concentrate at positions of the retaining walls and causes peeling and separations between film layers, which mainly occur between ITO/Ag/ITO in an anode layer.

The present invention provides an array substrate and a display panel. By providing vias in an anode layer at a retaining wall, stress of the anode layer at the retaining wall is reduced, and film layers at the retaining wall are prevented from peeling, thereby affecting technical problems of displays.

In order to solve the above problems, the technical solution provided by the present invention is as follows:

The present invention provides an array substrate comprising: a display area and a non-display area surrounding the display area;
wherein the array substrate comprises:
a substrate;
an anode layer disposed on the substrate; and
a first retaining wall disposed on the anode layer and around the display area; and
wherein the anode layer is provided with a first stress buffer area corresponding to the first retaining wall, and the first stress buffer area is provided with a first via structure passing through the anode layer.

According to an embodiment of the present invention, the first stress buffer area is disposed around the display area, and at least one end of the first retaining wall adjacent to the display area is disposed in the first stress buffer area.

According to an embodiment of the present invention, a distance between a boundary of the first stress buffer area adjacent to a side of the display area and the first retaining wall is greater than 10 micrometers.

According to an embodiment of the present invention, the array substrate further comprises a second retaining wall disposed on the anode layer and a second stress buffer area corresponding to the second retaining wall, and a second via structure is disposed in the second stress buffer area;
wherein the second retaining wall is disposed around the display area and disposed at a side of the first retaining wall adjacent to the display area.

According to an embodiment of the present invention, the second stress buffer area is disposed around the display area, and the second retaining wall is disposed in the second stress buffer area.

According to an embodiment of the present invention, distances between either boundary of the second stress buffer area and the second retaining wall are greater than 10 micrometers.

According to an embodiment of the present invention, both the first via structure and the second via structure comprise: a plurality of vias disposed surrounding the display area and spaced apart from each other.

According to an embodiment of the present invention, the vias comprise a plurality of continuous or discontinuous sub-vias in a direction away from the display area.

According to an embodiment of the present invention, the via of the first via structure has the same or different structure as the via of the second via structure.

A display panel, comprising an array substrate, and an organic light emitting layer and a thin film encapsulation layer sequentially disposed on the array substrate,
wherein the array substrate comprises a display area and a non-display area surrounding the display area; and
wherein the array substrate comprises:
a substrate;
an anode layer disposed on the substrate; and
a first retaining wall disposed on the anode layer and around the display area;
wherein the anode layer is provided with a first stress buffer area corresponding to the first retaining wall, and the first stress buffer area is provided with a first via structure passing through the anode layer.

According to an embodiment of the present invention, the first stress buffer area is disposed around the display area, and at least one end of the first retaining wall adjacent to the display area is disposed in the first stress buffer area.

According to an embodiment of the present invention, a distance between a boundary of the first stress buffer area adjacent to a side of the display area and the first retaining wall is greater than 10 micrometers.

According to an embodiment of the present invention, the array substrate further comprises a second retaining wall disposed on the anode layer and a second stress buffer area corresponding to the second retaining wall, and a second via structure is disposed in the second stress buffer area;
wherein the second retaining wall is disposed around the display area and disposed at a side of the first retaining wall adjacent to the display area.

According to an embodiment of the present invention, the second stress buffer area is disposed around the display area, and the second retaining wall is disposed in the second stress buffer area.

According to an embodiment of the present invention, distances between either boundary of the second stress buffer area and the second retaining wall are greater than 10 micrometers.

According to an embodiment of the present invention, both the first via structure and the second via structure comprise: a plurality of vias disposed surrounding the display area and spaced apart from each other.

According to an embodiment of the present invention, the vias comprise a plurality of continuous or discontinuous sub-vias in a direction away from the display area.

According to an embodiment of the present invention, the via of the first via structure has the same or different structure as the via of the second via structure.

According to an embodiment of the present invention, a height of the first retaining wall is greater than a height of the second retaining wall.

According to an embodiment of the present invention, the first via structure covered by the first retaining wall is filled with the same material as the first retaining wall; and
the second via structure covered by the second retaining wall is filled with the same material as the second retaining wall.

The present invention reduces stress on an anode layer at a retaining wall by providing a via structure in the anode layer at the retaining wall, thereby preventing peeling and separations between a metal layer and a conductive film in the anode layer due to excessive stress.

BRIEF DESCRIPTION OF THE SEVERAL VIEWS OF THE DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DESCRIPTION OF SPECIFIC EMBODIMENTS OF THE INVENTION

The following embodiments refer to the accompanying figures for exemplifying specific implementable embodiments of the present disclosure in a suitable computing environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

The present invention is directed to a current array substrate and a display panel. Due to large undulations at a retaining wall, stress on an anode layer at the retaining wall is large, so that the anode layer is peeled off.

This embodiment can solve above defects.

The present invention provides an array substrate comprising a display area and a non-display area surrounding the display area;
wherein the array substrate comprises:
a substrate;
an anode layer disposed on the substrate; and
a first retaining wall disposed on the anode layer and around the display area; and
wherein the anode layer is provided with a first stress buffer area corresponding to the first retaining wall, and the first stress buffer area is provided with a first via structure passing through the anode layer.

Figure 1A:
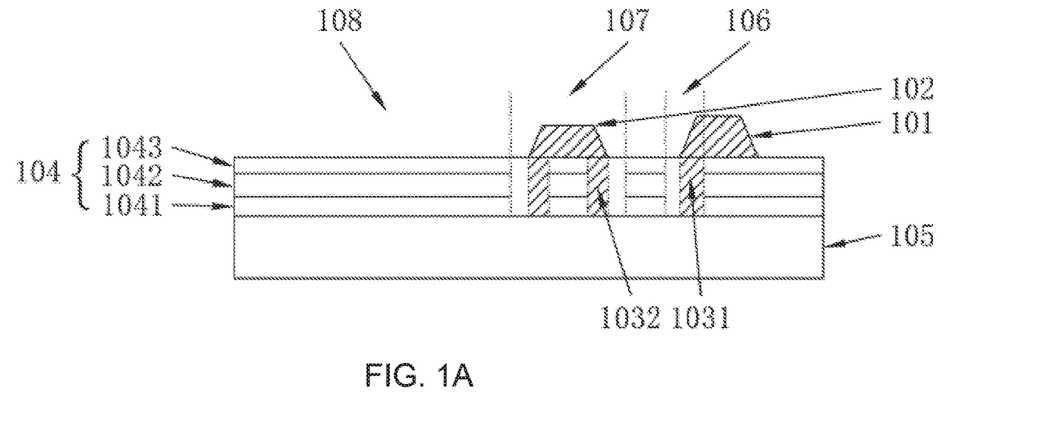
FIG. 1A is a schematic structural view of an array substrate according to an embodiment of the present invention.
Figure 1B:
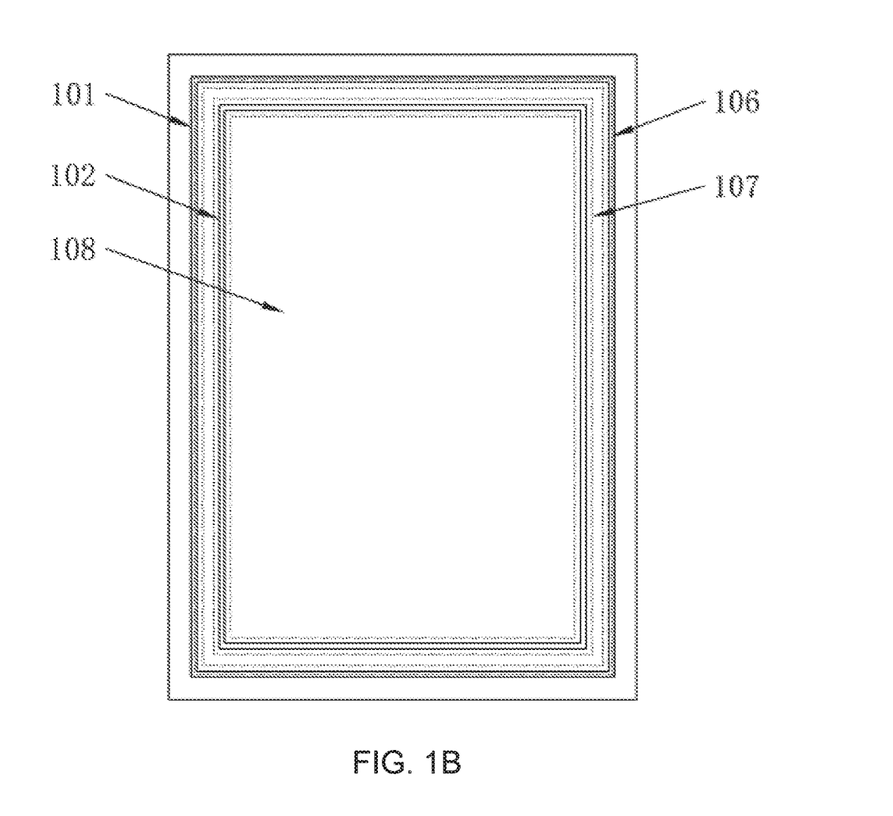
FIG. 1B is a schematic plan view of the array substrate according to an embodiment of the present invention.

Specifically, as shown in FIG. 1A and FIG. 1B, an array substrate is provided according to an embodiment of the present invention. The array substrate comprises a substrate 105, an anode layer 104 disposed on the substrate 105, and a first retaining wall 101 disposed on the anode layer 104. The first retaining wall 101 is disposed around a display area 108 of the substrate 105.

The anode layer 104 comprises conductive films 1041, 1043, and a metal layer 1042 disposed with each other. The first conductive film 1041 and the second conductive film 1043 are disposed on both sides of the metal layer 1042.

In addition, the anode layer 104 is provided with a first stress buffer area 106 corresponding to the first retaining wall 101, and the first stress buffer area 106 is provided with a first via structure 1031 passing through the anode layer 104.

That is, the first via structure 1031 passes through the first conductive film 1041, the metal layer 1042, and the second conductive film 1043.

In an implementation and application, the array substrate has many film interfaces and undulations at a position where the retaining wall is disposed, so that stress is easily concentrated at the position of the retaining wall, and causes the film layers being peeled off, which mainly occur between the conductive films and the metal layer in the anode layer. In the embodiment, by providing the via structure in the anode layer at the retaining wall, a buffer area is provided for the stress, and the stress on the anode layer at the retaining wall is reduced, thereby preventing peeling and separations between the conductive films and the metal layer in the anode layer.

The material of the first conductive film 1041 and the second conductive film 1043 comprises indium tin oxide (ITO), and the material of the metal layer 1042 comprises silver.

Further, as shown in FIG. 1A and FIG. 1B, the first stress buffer area 106 is disposed around the display area 108, and at least one end of the first retaining wall 101 adjacent to the display area 108 is disposed at the first stress buffer area 106.

There are two cases. In a first case, a side of the first retaining wall 101 adjacent to the display area 108 is disposed in the first stress buffer area 106. That is, part of the first retaining wall 101 is disposed in the first stress buffer area 106. In the second case, the whole first retaining wall 101 is disposed in the first stress buffer area 106.

In a second case, an orthographic projection area of the first retaining wall 101 on the metal layer 104 is equal to or less than an area of the first stress buffer area 106.

Also, a distance between a boundary of the first stress buffer area 106 adjacent to a side of the display area 108 and the first retaining wall 101 is greater than 10 micrometers.

It should be noted that the first via structure 1031 is disposed in the first stress buffer area 106, and there are three cases in which the first via structure 1031 is set.

In a first case, as shown in FIG. 1A, a portion of the first via structure 1031 is covered by the first retaining wall 101, and there is also a portion of the first via structure 1031 is disposed outside the orthographic projection area of the first retaining wall 101 on the metal layer 104. In the embodiment, a portion of the first hole structure 1031 is disposed at an end of the first retaining wall 101 adjacent to the display area 108.

In a second case, the first via structure 1031 is only disposed outside the orthographic projection area of the first retaining wall 101 on the metal layer 104.

In a third case, the whole first via structure 1031 is covered by the first retaining wall 101.

The second and third cases are not shown in the drawings, and the subsequent embodiments are only detailed according to the first case.

In addition, in the embodiment, the array substrate further comprises a second retaining wall 102 disposed on the anode layer 104 and a second stress buffer area 107 corresponding to the second retaining wall 104, and a second via structure 1032 is disposed in the second stress buffer area 107.

The second retaining wall 102 is disposed around the display area 108 and disposed at a side of the first retaining wall 101 adjacent to the display area 108.

An orthographic projection area of the second retaining wall 102 on the metal layer 104 is less than an area of the second stress buffer area 107.

Distances between either boundary of the second stress buffer area 107 and the second retaining wall 102 are greater than 10 micrometers.

It should be noted that the second via structure 1032 is disposed in the second stress buffer area 107, and there are three cases in which the second via structure 1032 is set.

In a first case, as shown in FIG. 1A, a portion of the second via structure 1032 is covered by the second retaining wall 102, and there is also a portion of the second via structure 1032 disposed in two ends of the second retaining wall 102.

In a second case, the second via structure 1032 is only disposed at two ends of the second retaining wall 102.

In a third case, the whole second via structure 1032 is covered by the second retaining wall 102.

The second and third cases are not shown in the drawings, and the subsequent embodiments are only detailed according to the first case.

In the embodiment, a height of the first retaining wall 101 is greater than a height of the second retaining wall 102, which can not only strengthen the restraining effect of the retaining wall on the film layer prepared in its surrounding, but also strengthen the preventive effect on water vapor intrusion.

In addition, the first via structure 1031 covered by the first retaining wall 101 is filled with the same material as the first retaining wall 101, and the second via structure 1032 covered by the second retaining wall 102 is filled with the same material as the second retaining wall 102.

The material of the first retaining wall 101 and the second retaining wall 102 comprises organic materials such as polyimide.

In the embodiment, by filling the same material in the via structure as the retaining wall, an adhesion between the retaining wall and the anode layer can be increased, and a bonding strength between the film layers in the array substrate can be improved.

In the embodiment, both the first via structure 1031 and the second via structure 1032 comprise: a plurality of vias disposed around the display area 108 and spaced apart from each other.

The vias comprise a plurality of continuous or discontinuous sub-vias in a direction away from the display area 108.

That is, the vias may be continuous vias in the direction away from the display area 108, or may be discontinuous vias in the direction away from the display area 108.

The first via structure 1031 is disposed in the first stress buffer area 106, the second via structure 1032 is disposed in the second stress buffer area 107, and both of them are disposed around the display area 108. Both the first via structure 1031 and the second via structure 1032 are vias spaced apart from each other in the direction around the display area 108.

The via of the first via structure 1031 has the same or different structure as the via of the second via structure 1032. That is, designs of the first via structure 1031 and the second via structure 1032 may be the same or not the same.

Both widths of the first via structure 1031 and the second via structure 1032 are 1 to 1000 micrometers, and a distance between the first via structure 1031 and the second via structure 1032 in the direction around the display area 108 is greater than 10 micrometers.

The shape of the first via structure 1031 and the second via structure 1032 comprises a rectangle or a circle, as described in the following embodiments.

As shown in FIG. 1A, the first via structure 1031 is a continuous via in the first stress buffer area 106 in the direction away from the display area 108, and the second via structure 1032 is a discontinuous via in the second stress buffer area 107 in the direction away from the display area 108.

Figure 2:
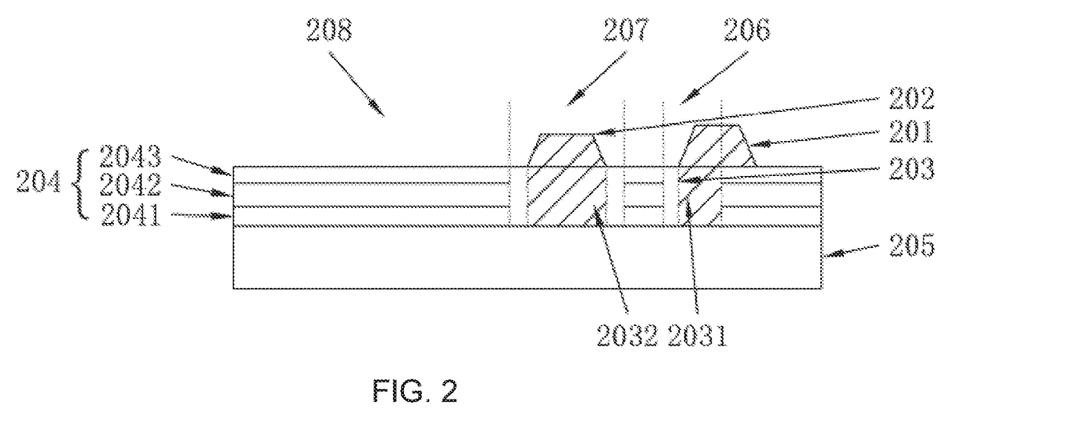
FIG. 2 is a schematic structural view of another array substrate according to an embodiment of the present invention.

As shown in FIG. 2, the array substrate comprises a substrate 205, an anode layer 204 disposed on the substrate 205, and a first retaining wall 201 and a second retaining wall 202 disposed on the anode layer 204. The first retaining wall 201 and the second retaining wall 202 are disposed around the display area 208 of the substrate 205, and the second retaining wall 202 is disposed at a position of the first retaining wall 201 adjacent to a side of the display area 208.

The anode layer 204 comprises conductive films 2041, 2043, and a metal layer 2042 disposed with each other, and the first conductive film 2041 and the second conductive film 2043 are disposed on two sides of the metal layer 2042.

In addition, a first stress buffer area 206 corresponding to the first retaining wall 201 is disposed on the anode layer 204, and a first via structure 2031 passing through the anode layer 204 is disposed in the first stress buffer area 206.

The anode layer 204 is further provided with a second stress buffer area 207 corresponding to the second retaining wall 202, and a second via structure 2032 passing through the anode layer 204 is disposed in the second stress buffer area 207.

That is, the first via structure 2031 and the second via structure 2032 pass through the first conductive film 2041, the metal layer 2042, and the second conductive film 2043.

The materials of the first conductive film 2041 and the second conductive film 2043 comprise indium tin oxide (ITO), and the material of the metal layer 2042 comprises silver.

In addition, the first via structure 2031 covered by the first retaining wall 201 is filled with the same material as the first retaining wall 201, and the second via structure 2032 covered by the second retaining wall 202 is filled with the same material as the second retaining wall 202.

The material of the first retaining wall 201 and the second retaining wall 202 comprises organic materials such as polyimide.

In the embodiment, by filling the same material in the via structure as the retaining wall, an adhesion between the retaining wall and the anode layer can be increased, and a bonding strength between the film layers in the array substrate can be improved.

The first via structure 2031 is in the first stress buffer area 206 and the second via structure 2032 is in the second stress buffer area 207, and both of them are vias disposed around the display area 208 and spaced apart from each other.

The first via structure 2031 is in the first stress buffer area 206 and the second via structure 2032 is in the second stress buffer area 207, and both of them are continuous vias in a direction away from the display area 208.

In summary, the embodiment provides the buffer stress areas by providing the via structures passing through the anode layer in the anode layer at the retaining wall, thereby reducing the stress on the anode layer at the retaining wall and preventing the peeling between the conductive films and the metal layer in the anode layer.

A distribution of the via structure in the metal layer will be described in detail below with reference to specific embodiments.

The First Embodiment

Figure 3:
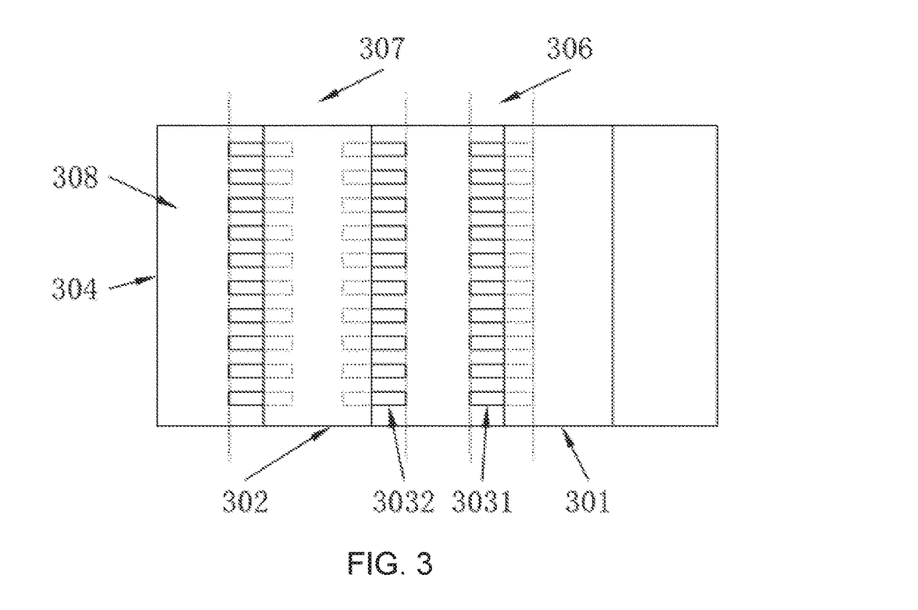
FIG. 3 is a schematic plan view of a via structure according to an embodiment of the present invention.

FIG. 3 is a schematic plan view of a via structure provided in the embodiment, and FIG. 3 is only a partial array substrate structure for illustration.

The array substrate, as described above, comprises an anode layer 304 disposed on a substrate, a first retaining wall 301 disposed on the anode layer 304, a first stress buffer area 306 corresponding to the first retaining wall 301, a second retaining wall 302 disposed on the anode layer 304, a second stress buffer area 307 corresponding to the second retaining wall 302, and a first via structure 3031 disposed in the first stress buffer area 306 and a second via structure 3032 disposed in the second stress buffer area 307.

Both the first via structure 3031 and the second via structure 3032 are disposed around the display area 308 and are spaced apart from each other in a direction surrounding the display area 308.

The first via structure 3031 and the second via structure 3032 are arranged in parallel in a direction away from the display area 308. The first via structure 3031 is a continuous via in the first stress buffer area 306 in the direction away from the display area 308, and the second via structure 3032 is a discontinuous via in the second stress buffer area 307 in the direction away from the display area 308.

In the first stress buffer area 306 of the embodiment, the first via structure 3031 is a rectangular via. A portion of the first via structure 3031 is disposed at one end of the first retaining wall 301 adjacent to the display area 308, and another portion of the first via structure 3031 is covered by the first retaining wall 301.

In the second stress buffer area 307, the second via structure 3032 is a rectangular via. A portion of the second via structure 3032 is disposed at two ends of the second retaining wall 302, and another portion of the second via structure 3032 is covered by the second retaining wall 302. The portion of the second via structure 3032 covered by the second retaining wall 302 is a discontinuous via in the direction away from the display area 308.

In the embodiment, the via structures are provided to reduce the stress on the anode layer at the retaining wall to prevent the peeling between the conductive films and the metal layer in the anode layer.

The Second Embodiment

Figure 4:
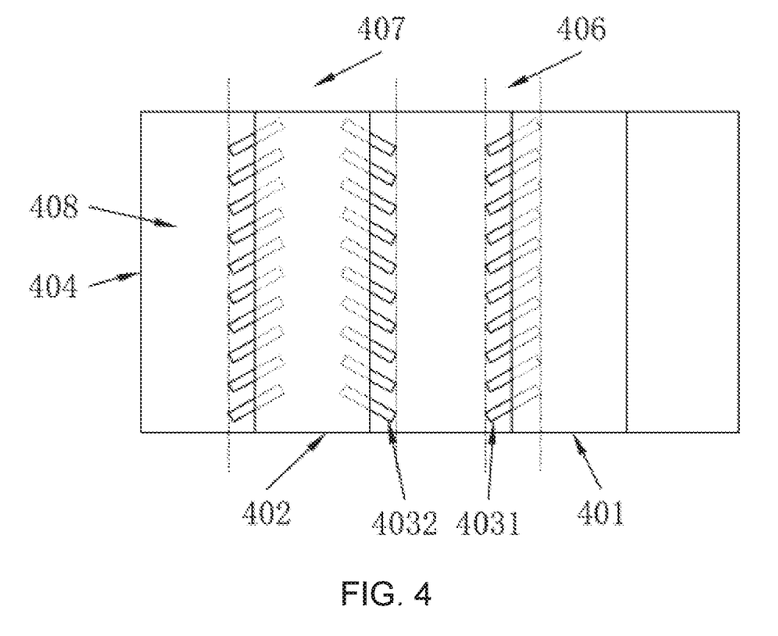
FIG. 4 is a schematic plan view of another via structure according to an embodiment of the present invention.

FIG. 4 is a schematic plan view of a via structure provided in the embodiment, and FIG. 4 is only a partial array substrate structure for illustration.

The array substrate, as described above, comprises an anode layer 404 disposed on a substrate, a first retaining wall 401 disposed on the anode layer 404, a first stress buffer area 406 corresponding to the first retaining wall 401, a second retaining wall 402 disposed on the anode layer 404, a second stress buffer area 407 corresponding to the second retaining wall 402, and a first via structure 4031 disposed in the first stress buffer area 406 and a second via structure 4032 disposed in the second stress buffer area 407.

Both the first via structure 4031 and the second via structure 4032 are disposed around the display area 408 and are spaced apart from each other in a direction surrounding the display area 408.

The first via structure 4031 and the second via structure 4032 are disposed at an angle different from the direction away from the display area 408. The first via structure 4031 is a continuous via in the first stress buffer area 406 in the direction away from the display area 408, and the second via structure 4032 is a discontinuous via in the second stress buffer area 407 in the direction away from the display area 408.

In the first stress buffer area 406 of the embodiment, the first via structure 4031 is a rectangular via. A portion of the first via structure 4031 is disposed at one end of the first retaining wall 401 adjacent to the display area 408, and another portion of the first via structure 4031 is covered by the first retaining wall 401.

In the second stress buffer area 407, the second via structure 4032 is a rectangular via. A portion of the second via structure 4032 is disposed at two ends of the second retaining wall 402, and another portion of the second via structure 4032 is covered by the second retaining wall 402.

The portion of the second via structure 4032 covered by the second retaining wall 402 is a discontinuous via in the direction away from the display area 408.

In the embodiment, the via structures are provided to reduce the stress on the anode layer at the retaining wall to prevent the peeling between the conductive films and the metal layer in the anode layer.

The Third Embodiment

Figure 5:
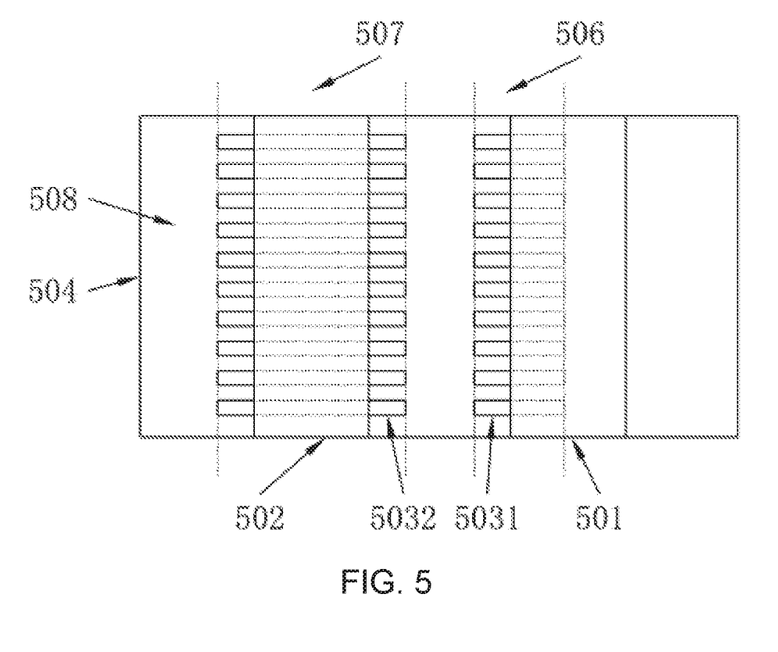
FIG. 5 is a schematic plan view of another via structure according to an embodiment of the present invention.

FIG. 5 is a schematic plan view of a via structure provided in the embodiment, and FIG. 5 is only a partial array substrate structure for illustration.

The array substrate, as described above, comprises an anode layer 504 disposed on a substrate, a first retaining wall 501 disposed on the anode layer 504, a first stress buffer area 506 corresponding to the first retaining wall 501, a second retaining wall 502 disposed on the anode layer 504, a second stress buffer area 507 corresponding to the second retaining wall 502, and a first via structure 5031 disposed in the first stress buffer area 506 and a second via structure 5032 disposed in the second stress buffer area 507.

Both the first via structure 5031 and the second via structure 5032 are disposed around the display area 508 and are spaced apart from each other in a direction surrounding the display area 508.

Both the first via structure 5031 and the second via structure 5032 are arranged in parallel away from the display area 508. The first via structure 5031 is a continuous via in the first stress buffer area 506 in the direction away from the display area 508, and the second via structure 5032 is a continuous via in the second stress buffer area 507 in the direction away from the display area 508.

In the first stress buffer area 506 of the embodiment, the first via structure 5031 is a rectangular via. A portion of the first via structure 5031 is disposed at one end of the first retaining wall 501 adjacent to the display area 508, and another portion of the first via structure 5031 is covered by the first retaining wall 501.

In the second stress buffer area 507, the second via structure 5032 is a rectangular via. A portion of the second via structure 5032 is disposed at two ends of the second retaining wall 502, and another portion of the second via structure 5032 is covered by the second retaining wall 502. The portion of the second via structure 5032 covered by the second retaining wall 502 is a continuous via in the direction away from the display area 508.

In the embodiment, the via structures are provided to reduce the stress on the anode layer at the retaining wall to prevent the peeling between the conductive films and the metal layer in the anode layer.

The Fourth Embodiment

Figure 6:
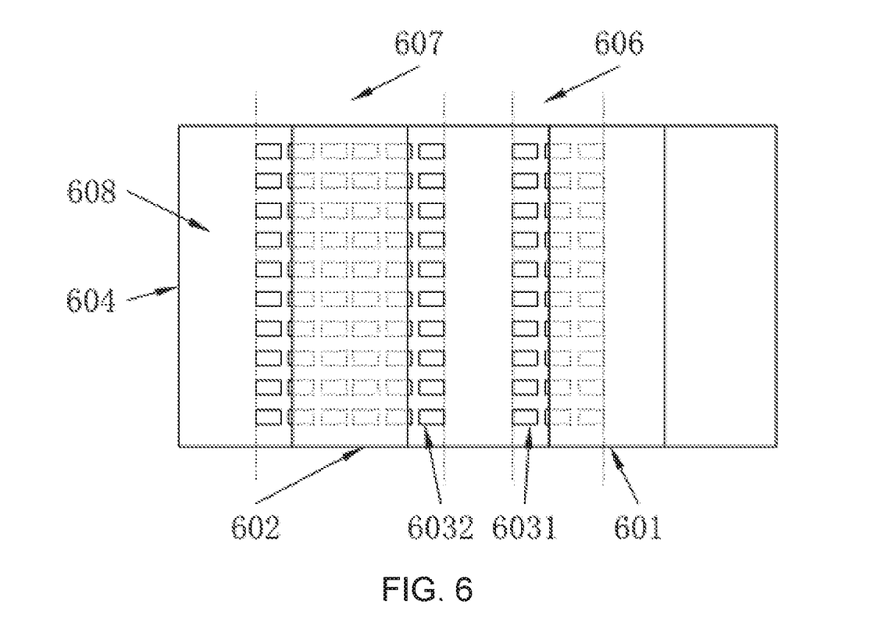
FIG. 6 is a schematic plan view of another via structure according to an embodiment of the present invention.

FIG. 6 is a schematic plan view of a via structure provided in the embodiment, and FIG. 6 is only a partial array substrate structure for illustration.

The array substrate, as described above, comprises an anode layer 604 disposed on a substrate, a first retaining wall 601 disposed on the anode layer 604, a first stress buffer area 606 corresponding to the first retaining wall 601, a second retaining wall 602 disposed on the anode layer 604, a second stress buffer area 607 corresponding to the second retaining wall 602, and a first via structure 6031 disposed in the first stress buffer area 606 and a second via structure 6032 disposed in the second stress buffer area 607.

Both the first via structure 6031 and the second via structure 6032 are disposed around the display area 608 and are spaced apart from each other in a direction surrounding the display area 608.

Both the first via structure 6031 and the second via structure 032 are arranged in parallel away from the display area 608. The first via structure 6031 is a discontinuous via in the first stress buffer area 606 in the direction away from the display area 608, and the second via structure 6032 is a discontinuous via in the second stress buffer area 607 in the direction away from the display area 608.

In the first stress buffer area 606 of the embodiment, the first via structure 6031 is a rectangular via. A portion of the first via structure 6031 is disposed at one end of the first retaining wall 601 adjacent to the display area 608, and another portion of the first via structure 6031 is covered by the first retaining wall 601. The portion of the first via structure 6031 covered by the first retaining wall 601 is a discontinuous via in the direction away from the display area 608.

In the second stress buffer area 607, the second via structure 6032 is a rectangular via. A portion of the second via structure 6032 is disposed at two ends of the second retaining wall 602, and another portion of the second via structure 6032 is covered by the second retaining wall 602. The portion of the second via structure 6032 covered by the second retaining wall 602 is a discontinuous via in the direction away from the display area 608.

In the embodiment, the via structures are provided to reduce the stress on the anode layer at the retaining wall to prevent the peeling between the conductive films and the metal layer in the anode layer.

The Fifth Embodiment

Figure 7:
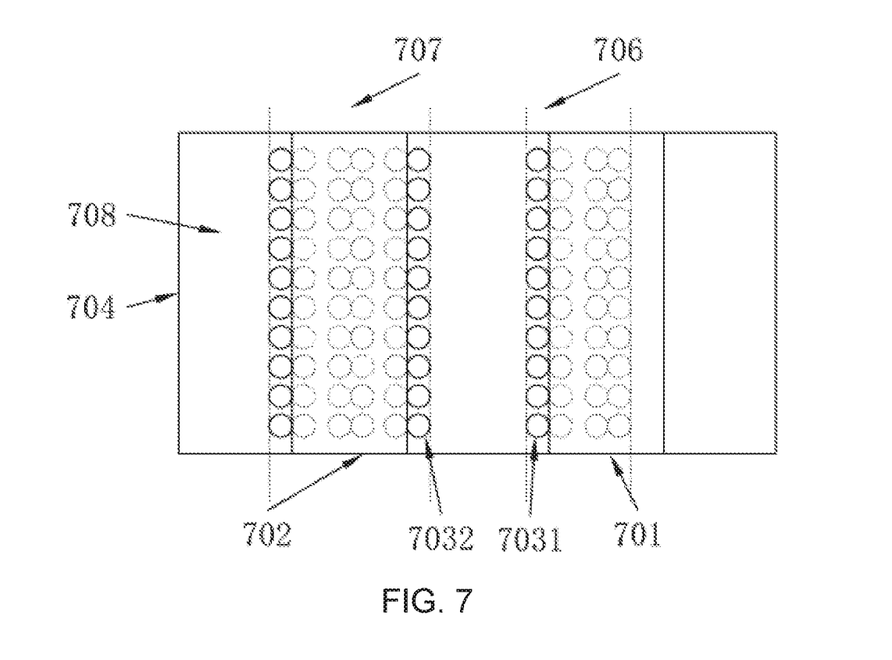
FIG. 7 is a schematic plan view of another via structure according to an embodiment of the present invention.

FIG. 7 is a schematic plan view of a via structure provided in the embodiment, and FIG. 7 is only a partial array substrate structure for illustration.

The array substrate, as described above, comprises an anode layer 704 disposed on a substrate, a first retaining wall 701 disposed on the anode layer 704, a first stress buffer area 706 corresponding to the first retaining wall 701, a second retaining wall 702 disposed on the anode layer 704, a second stress buffer area 707 corresponding to the second retaining wall 702, and a first via structure 7031 disposed in the first stress buffer area 706 and a second via structure 7032 disposed in the second stress buffer area 707.

Both the first via structure 7031 and the second via structure 7032 are disposed around the display area 708 and are spaced apart from each other in a direction surrounding the display area 708.

Both the first via structure 7031 and the second via structure 7032 are arranged in parallel away from the display area 708. The first via structure 7031 is a discontinuous via in the first stress buffer area 706 in the direction away from the display area 708, and the second via structure 7032 is a discontinuous via in the second stress buffer area 707 in the direction away from the display area 708.

In the first stress buffer area 706 of the embodiment, the first via structure 7031 is a circular via. A portion of the first via structure 7031 is disposed at one end of the first retaining wall 701 adjacent to the display area 708, and another portion of the first via structure 7031 is covered by the first retaining wall 701. The portion of the first via structure 7031 covered by the first retaining wall 701 is a discontinuous via in the direction away from the display area 708.

In the second stress buffer area 707, the second via structure 7032 is a circular via. A portion of the second via structure 7032 is disposed at two ends of the second retaining wall 702, and another portion of the second via structure 7032 is covered by the second retaining wall 702. The portion of the second via structure 7032 covered by the second retaining wall 702 is a discontinuous via in the direction away from the display area 708.

In the embodiment, the via structures are provided to reduce the stress on the anode layer at the retaining wall to prevent the peeling between the conductive films and the metal layer in the anode layer.

It should be noted that a shape of the via structure is not limited to a rectangle and a circle, nor is it limited to whether the shape of the via structure in the first stress buffer area and the second stress buffer area are the same.

Figure 8:
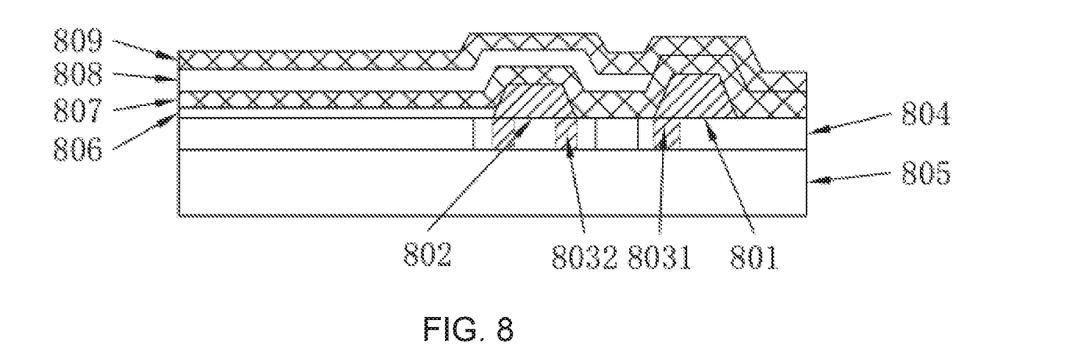
FIG. 8 is a schematic structural view of a display panel according to an embodiment of the present invention.

An embodiment of the present invention further provides a display panel. As shown in FIG. 8, the display panel comprises the above array substrate, an organic light emitting layer 806 disposed on the array substrate, and a package film.

The array substrate comprises a substrate 805, an anode layer 804 disposed on the substrate 805, a first retaining wall 801 and a second retaining wall 802 disposed on the anode layer 804, and a first via structure 8031 and a second via structure 8032 passing through the anode layer 804.

The organic light emitting layer 806 is disposed on the anode layer 804, and the organic light emitting layer 806 covers the display area and terminates at the second retaining wall 802.

A thin film encapsulation layer is disposed on the organic light emitting layer 806, and the thin film encapsulation layer comprises a first inorganic layer 807, an organic layer 808, and a second inorganic layer 809 which are stackedly disposed. The first inorganic layer 807 and the second inorganic layer 809 cover the display area, the first retaining wall 801, and the second retaining wall 802. The organic layer 808 covers the display area and the second retaining wall 802 and terminates at the first retaining wall 801.

Figure 9:
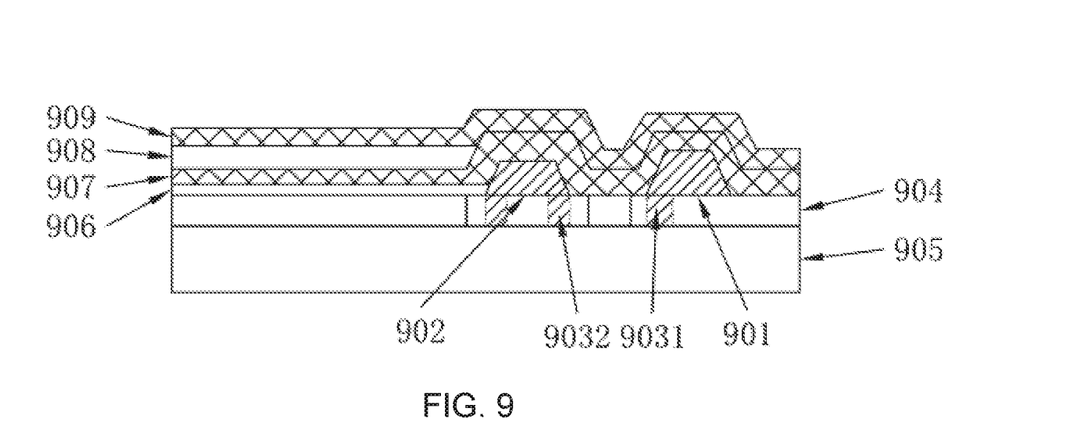
FIG. 9 is a schematic structural view of another display panel according to an embodiment of the present invention.

In another embodiment of the present invention, as shown in FIG. 9, the display panel comprises the above array substrate and an organic light emitting layer 906 and a package film disposed on the array substrate.

The array substrate comprises a substrate 905, an anode layer 904 disposed on the substrate 905, a first retaining wall 901 and a second retaining wall 902 disposed on the anode layer 904, and a first via structure 9031 and a second via structure 9032 passing through the anode layer 904.

The organic light emitting layer 906 is disposed on the anode layer 904, and the organic light emitting layer 906 covers the display area and terminates at the second retaining wall 902.

A thin film encapsulation layer is disposed on the organic light emitting layer 906, and the thin film encapsulation layer comprises a first inorganic layer 907, an organic layer 908, and a second inorganic layer 909 which are stackedly disposed. The first inorganic layer 907 and the second inorganic layer 909 cover the display area, the first retaining wall 901, and the second retaining wall 902. The organic layer 908 covers the display area and the second retaining wall 902 and terminates at the first retaining wall 901.

In summary, the display panel provided by the present invention reduces the risk of film peeling of the anode layer by providing the via structure in the anode layer to buffer the stress of the anode layer at the retaining wall.

In summary, although the present invention has been disclosed above in the preferred embodiments, the above preferred embodiments are not intended to limit the present invention. A person skilled in the art can make various modifications and refinements without departing from the spirit and scope of the invention, and the scope of the invention is defined by the claims.

What is claimed is:

1. An array substrate, comprising: a display area and a non-display area surrounding the display area;
wherein the array substrate comprises:
a substrate;
an anode layer disposed on the substrate; and
a first retaining wall disposed on the anode layer and around the display area; and
wherein the anode layer is provided with a first stress buffer area corresponding to the first retaining wall, and the first stress buffer area is provided with a first via structure passing through the anode layer.

2. The array substrate as claimed in claim 1, wherein the first stress buffer area is disposed around the display area, and at least one end of the first retaining wall adjacent to the display area is disposed in the first stress buffer area.

3. The array substrate as claimed in claim 2, wherein a distance between a boundary of the first stress buffer area adjacent to a side of the display area and the first retaining wall is greater than 10 micrometers.

4. The array substrate as claimed in claim 1, wherein the array substrate further comprises a second retaining wall disposed on the anode layer and a second stress buffer area corresponding to the second retaining wall, and a second via structure is disposed in the second stress buffer area;
wherein the second retaining wall is disposed around the display area and disposed at a side of the first retaining wall adjacent to the display area.

5. The array substrate as claimed in claim 4, wherein the second stress buffer area is disposed around the display area, and the second retaining wall is disposed in the second stress buffer area.

6. The array substrate as claimed in claim 5, wherein distances between either boundary of the second stress buffer area and the second retaining wall are greater than 10 micrometers.

7. The array substrate as claimed in claim 4, wherein both the first via structure and the second via structure comprise: a plurality of vias disposed around the display area and spaced apart from each other.

8. The array substrate as claimed in claim 7, wherein the vias comprise a plurality of continuous or discontinuous sub-vias in a direction away from the display area.

9. The array substrate as claimed in claim 8, wherein the via of the first via structure has the same or different structure as the via of the second via structure.

10. A display panel, comprising an array substrate, and an organic light emitting layer and a thin film encapsulation layer sequentially disposed on the array substrate,
wherein the array substrate comprises a display area and a non-display area surrounding the display area; and
wherein the array substrate comprises:
a substrate;
an anode layer disposed on the substrate; and
a first retaining wall disposed on the anode layer and around the display area;
wherein the anode layer is provided with a first stress buffer area corresponding to the first retaining wall, and the first stress buffer area is provided with a first via structure passing through the anode layer.

11. The display panel as claimed in claim 10, wherein the first stress buffer area is disposed around the display area, and at least one end of the first retaining wall adjacent to the display area is disposed in the first stress buffer area.

12. The display panel as claimed in claim 11, wherein a distance between a boundary of the first stress buffer area adjacent to a side of the display area and the first retaining wall is greater than 10 micrometers.

13. The display panel as claimed in claim 10, wherein the array substrate further comprises a second retaining wall disposed on the anode layer and a second stress buffer area corresponding to the second retaining wall, and a second via structure is disposed in the second stress buffer area;

wherein the second retaining wall is disposed around the display area and disposed at a side of the first retaining wall adjacent to the display area.

14. The display panel as claimed in claim 13, wherein the second stress buffer area is disposed around the display area, and the second retaining wall is disposed in the second stress buffer area.

15. The display panel as claimed in claim 14, wherein distances between either boundary of the second stress buffer area and the second retaining wall are greater than 10 micrometers.

16. The display panel as claimed in claim 13, wherein both the first via structure and the second via structure comprise: a plurality of vias disposed around the display area and spaced apart from each other.

17. The display panel as claimed in claim 16, wherein the vias comprise a plurality of continuous or discontinuous sub-vias in a direction away from the display area.

18. The display panel as claimed in claim 17, wherein the via of the first via structure has the same or different structure as the via of the second via structure.

19. The display panel as claimed in claim 13, wherein a height of the first retaining wall is greater than a height of the second retaining wall.

20. The display panel as claimed in claim 13, wherein the first via structure covered by the first retaining wall is filled with the same material as the first retaining wall; and the second via structure covered by the second retaining wall is filled with the same material as the second retaining wall.

* * * * *